United States Patent
Luo et al.

(10) Patent No.: US 7,618,866 B2
(45) Date of Patent: Nov. 17, 2009

(54) STRUCTURE AND METHOD TO FORM MULTILAYER EMBEDDED STRESSORS

(75) Inventors: Zhijiong Luo, Carmel, NY (US); Ricky S. Amos, Rhinebeck, NY (US); Nivo Rovedo, LaGrangeville, NY (US); Henry K. Utomo, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 11/423,227

(22) Filed: Jun. 9, 2006

(65) Prior Publication Data

US 2008/0006818 A1 Jan. 10, 2008

(51) Int. Cl.
*H01L 21/336* (2006.01)

(52) U.S. Cl. .............. 438/285; 438/282; 438/289; 438/596; 438/221; 438/423; 257/E21.358; 257/E21.541

(58) Field of Classification Search .......... 438/197, 438/221, 423, 424; 257/E21.541, E21.358, 257/E21.546
See application file for complete search history.

(56) References Cited

U.S. PATENT DOCUMENTS

| | | | |
|---|---|---|---|
| 5,264,713 A * | 11/1993 | Palmour | 257/77 |
| 5,442,205 A | 8/1995 | Brasen et al. | |
| 6,323,525 B1 | 11/2001 | Noguchi et al. | |
| 6,831,292 B2 | 12/2004 | Currie et al. | |
| 6,844,227 B2 | 1/2005 | Kubo et al. | |
| 6,921,913 B2 | 7/2005 | Yeo et al. | |
| 2004/0262694 A1 | 12/2004 | Chidambaram | |
| 2005/0012146 A1 * | 1/2005 | Murthy et al. | 257/336 |
| 2005/0082522 A1 | 4/2005 | Huang et al. | |
| 2005/0280098 A1 * | 12/2005 | Shin et al. | 257/371 |
| 2006/0022292 A1 * | 2/2006 | Shenoy | 257/472 |
| 2006/0244075 A1 * | 11/2006 | Chen et al. | 257/384 |
| 2006/0244077 A1 * | 11/2006 | Nowak | 257/394 |
| 2006/0252191 A1 * | 11/2006 | Kammler et al. | 438/197 |
| 2007/0020861 A1 * | 1/2007 | Chong et al. | 438/296 |

* cited by examiner

*Primary Examiner*—Zandra Smith
*Assistant Examiner*—Telly D Green
(74) *Attorney, Agent, or Firm*—Scully, Scott, Murphy & Presser, P.C; H. Daniel Schnurmann

(57) ABSTRACT

A multilayer embedded stressor having a graded dopant profile for use in a semiconductor structure for inducing strain on a device channel region is provided. The inventive multilayer stressor is formed within areas of a semiconductor structure in which source/drain regions are typically located. The inventive multilayer stressor includes a first conformal epi semiconductor layer that is undoped or lightly doped and a second epi semiconductor layer that is highly dopant relative to the first epi semiconductor layer. The first and second epi semiconductor layers each have the same lattice constant, which is different from that of the substrate they are embedded in. The structure including the inventive multilayer embedded stressor achieves a good balance between stress proximity and short channel effects, and even eliminates or substantially reduces any possible defects that are typically generated during formation of the deep source/drain regions.

9 Claims, 3 Drawing Sheets

STRUCTURE AND METHOD TO FORM MULTILAYER EMBEDDED STRESSORS

FIELD OF THE INVENTION

The present invention relates to a semiconductor structure and a method of fabricating the same. More particularly, the present invention relates to a complementary metal oxide semiconductor (CMOS) structure including a multilayer embedded stressor having a graded dopant profile and at least a first epitaxial (epi) semiconductor that is conformal.

BACKGROUND OF THE INVENTION

Mechanical stresses within a semiconductor device substrate have been widely used to modulate device performance. For example, in common Si technology, the channel of a transistor is oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in the film direction and/or under compressive stress in the direction normal of the channel. Therefore, compressive and/or tensile stresses can be advantageously created in the channel regions of a p-channel field effect transistor (pFET) and/or an n-channel field effect transistor (nFET) in order to enhance the performance of such devices.

One possible approach for creating a desirable stressed silicon channel region is to form embedded SiGe or Si:C stressors (i.e., stress wells) at the source and drain regions of a CMOS device to induce compressive or tensile strain in the channel region located between the source and drain regions. Although embedded stressor technology is now well-known, the integration of the embedded stressor into the normal CMOS process flow is extremely challenging. The extent of the performance of the CMOS device depends strongly on the stress generated by the embedded stressor itself, the active dopant concentration in the embedded stressor and the proximity of the embedded stressor to the device channel region.

The importance of overcoming the various deficiencies noted above in embedded stressor technology is evidenced by the extensive technological development directed to this subject material. Some of the more recent advances in this technology can be found, for example, in U.S. Pat. Nos. 6,921,913; 6,831,292; 6,844,227; 6,323,525; and 5,442,205 as well as U.S. Patent Application Publication Nos. 20050082522 and 20040262694 A1.

Despite these advances in the semiconductor industry, further improvement in embedded stressor technology is needed that provides a good balance between stressor proximity and short channels effects. Moreover, an embedded stressor technology is needed that also eliminates possible defect generation, which typically occurs during the ion implantation of deep source/drain regions in prior art embedded stressor technology.

SUMMARY OF THE INVENTION

In the present invention, a multilayer embedded stressor having a graded dopant profile and at least a first epi semiconductor layer that is conformal is provided. The inventive multilayer stressor is formed within areas of a semiconductor structure in which source/drain regions are typically located. The structure including the inventive multilayer embedded stressor achieves a good balance between stress proximity and short channel effects, and even eliminates or substantially reduces any possible defects that are typically generated during formation of the deep source/drain regions using deep implants.

In accordance with the present invention, a semiconductor structure including the inventive multilayer embedded stressor is provided which comprises:

at least one field effect transistor located on a surface of a semiconductor substrate; and a multilayer embedded stressor having a graded dopant profile and at least a first conformal epitaxial semiconductor layer located at a footprint of the at least one field effect transistor and in a recessed region of said semiconductor substrate, wherein said multilayer embedded stressor induces a strain upon a channel region of said at least one field effect transistor.

In one embodiment of the present invention, the at least one field effect transistor (FET) is a pFET and the multilayer embedded stressor comprises SiGe. In yet another embodiment of the present invention, the at least one field effect transistor is an nFET and the multilayer embedded stressor comprises Si:C. In still yet another embodiment of the present invention, the structure includes at least one pFET and at least one nFET that are separated by an isolation region, wherein said multilayer embedded stressor associated with said pFET comprises SiGe, and the multilayer embedded stressor associated with said nFET comprises Si:C.

As indicated above, the multilayer embedded stressor comprises at least a first epi semiconductor layer that is conformally disposed within the recessed region of the substrate. The first epi semiconductor layer may be undoped or lightly doped. The multilayer embedded stressor of the present invention also includes a second epi semiconductor layer which is disposed atop the first epi semiconductor layer. This second epi semiconductor layer is highly doped relative to the dopant concentration of the first epi semiconductor layer.

In the embodiment wherein pFETs are formed on a single crystal Si substrate, the multilayer embedded stressor comprises a first epi SiGe layer conformally disposed in the recessed region and a second epi SiGe layer disposed atop the first epi SiGe layer. In accordance with the present invention, the first epi SiGe is undoped or lightly doped, while the second epi SiGe layer is highly doped relative to the first epi SiGe layer.

In the embodiment wherein nFETs are formed on a single crystal Si substrate, the multilayer embedded stressor comprises a first epi Si:C layer conformally disposed in the recessed region and a second epi Si:C layer disposed atop the first epi Si:C layer. In accordance with the present invention, the first epi Si:C is undoped or lightly doped, while the second epi Si:C layer is highly doped relative to the first epi Si:C layer.

In addition to the structure mentioned above, the present invention also provides a method of fabricating the same. In general terms, the method of the present invention comprises:

providing at least one field effect transistor having an extension spacer on a surface of a semiconductor substrate, said semiconductor substrate having a recessed region at a footprint of the at least one field effect transistor;

conformally growing a first epitaxial semiconductor layer on exposed surfaces of said semiconductor substrate in said recessed region, said first epitaxial semiconductor layer having a lattice constant that is different from a lattice constant of said semiconductor substrate;

forming a second epitaxial semiconductor layer on said first epitaxial semiconductor layer, wherein said second epitaxial semiconductor has the same lattice constant as the first epitaxial semiconductor layer and a higher dopant concentration than the first epitaxial semiconductor layer; and forming an extension region within upper portions of said first and second epitaxial semiconductor layers.

It is noted that since the first epitaxial (epi) semiconductor layer is formed conformally with the recessed region, the multilayer embedded stressor thus formed (e.g., combination of first and second epi semiconductor layers) follows the contour of the recessed region that is formed into the semiconductor substrate. In some embodiments of the present invention, the multilayer embedded stressor contains substantially no rounded corners.

DETAILED DESCRIPTION OF THE INVENTION

The present invention, which provides a structure including a multilayer embedded stressor in close proximity to the device channel and a method of fabricating such a structure, will now be described in greater detail by referring to the following discussion and drawings that accompany the present application. It is noted that the drawings are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above a multilayer embedded stressor having a graded dopant profile and at least a first epi semiconductor layer that is conformally disposed within a recessed region provided in the semiconductor substrate is provided for use in a semiconductor structure having a least one CMOS device. The inventive multilayer stressor is formed within areas of a semiconductor structure in which source/drain regions are typically located. The structure including the inventive multilayer embedded stressor achieves a good balance between stress proximity and short channel effects, and even eliminates or substantially reduces possible defect that are typically generated during formation of the deep source/drain regions. In some embodiments of the present invention, the inventive multilayer embedded stressor contains substantially no rounded corners.

Figure 1:
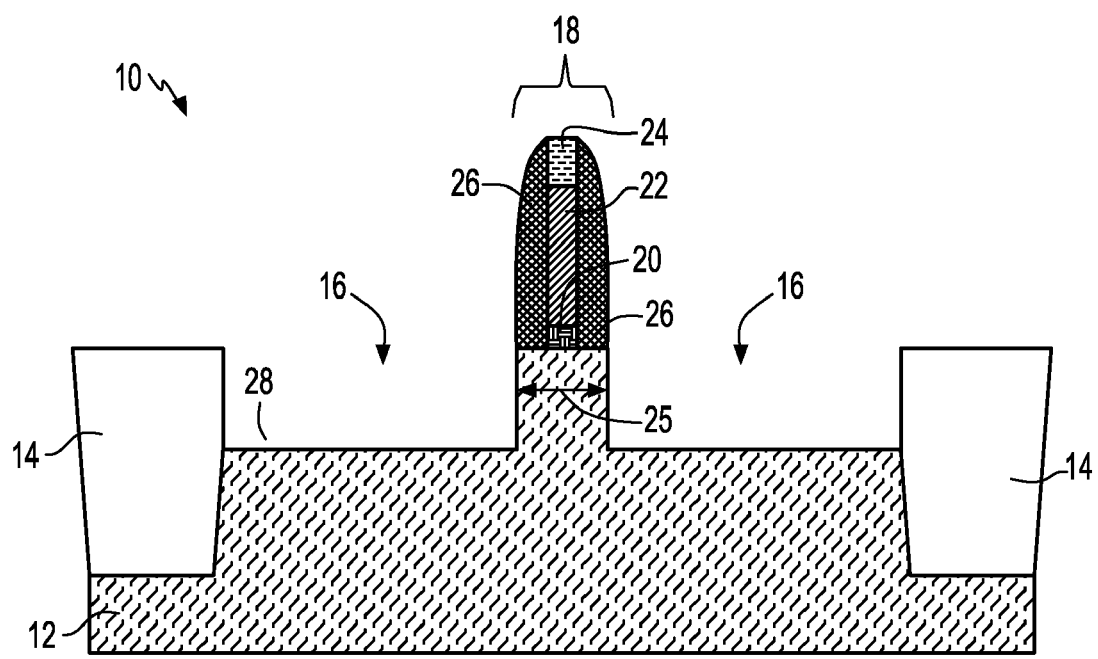
FIG. 1 is a pictorial representation (through a cross sectional view) depicting a structure wherein a portion of the substrate at the footprint of a field effect transistor including a single, narrow spacer is recessed.
Figure 2:
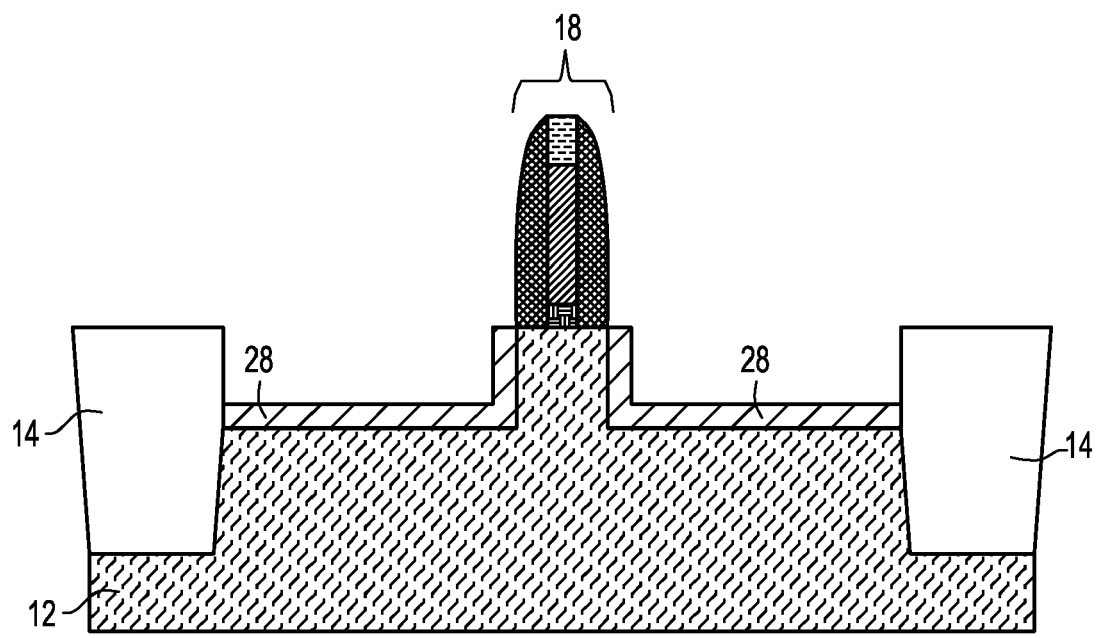
FIG. 2 is a pictorial representation (through a cross sectional view) depicting the structure of FIG. 1 after conformally disposing a first epi semiconductor layer having a lattice contact that is different from the substrate within the recessed portion of the substrate.

Reference is first made to FIG. 1 which illustrates an initial structure 10 that is employed in the present invention. As is illustrated, the initial structure 10 includes a semiconductor substrate 12 having at least one isolation region 14 formed therein (a pair of isolation regions are specifically shown in the drawings). The initial structure 10 also includes a recessed region 16 that is formed in a portion of the semiconductor substrate 12. The recessed region 16 is located at the footprint of at least one field effect transistor (FET) 18.

Although FIG. 1 and the remaining drawings show a single FET, the present invention contemplates forming a plurality of FETs on a same semiconductor substrate 12. The plurality of FETs may have the same conductivity (i.e., all nFETs or all pFETs). Alternatively, the plurality of FETs may have different conductivities (i.e., some nFETs and some pFETs). When different plurality FETs are formed, the same basic processing steps as illustrated in FIGS. 1-5 are employed except that block masks can be used to process one set of FETs, while protecting the other set of FETs.

The at least one FET 18 includes a gate stack comprising a gate dielectric 20, a gate conductor 22, and a dielectric cap 24. A first, narrow spacer 26 is located on sidewalls of the gate stack. A device channel 25 is located in a mesa portion of the substrate 12.

The various components of the initial structure are comprised of conventional materials that are well known to those skilled in the art. Also, the initial structure 10, up to the formation of the first, narrow spacer 26, but not including the formation of the recessed region 16, is fabricated utilizing techniques well known to those skilled.

The semiconductor substrate 12 of the initial structure 10 employed in the present invention comprises any semiconducting material including, but not limited to: Si, Ge, SiGe, SiC, SiGeC, Ga, GaAs, InAs, InP and all other III/V or TI/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. In accordance with the present invention, semiconductor substrate 12 has a first lattice constant that is different from the embedded multiple stressor to be subsequently formed.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of the specific FET formed. For example, the hybrid substrate allows for providing a structure in which a pFET can be formed on a {110} crystal orientation, while the nFET can be formed on a {100} crystal orientation. When a hybrid substrate is used, it may have SOI-like properties, bulk-like properties or a combination of SOI- and bulk-like properties.

The semiconductor substrate 12 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells".

At least one isolation region 14 is then typically formed into the semiconductor substrate 12. The isolation region 14 may be a trench isolation region (as shown) or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

At this point of the present invention, a conventional CMOS process flow including deposition of various material layers of the gate stack, lithography and etching can be used in forming the FET 18. Alternatively, a replacement gate process can be used in forming the FET 18.

As stated above, the FET 18 includes a gate stack comprising a gate dielectric 20, a gate conductor 22, and a dielectric cap 24. The gate dielectric 20, which is disposed on a surface of the semiconductor substrate 12, can be formed by a thermal growth process such as, for example, oxidation, nitridation or oxynitridation. Alternatively, the gate dielectric 20 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 20 may also be formed utilizing any combination of the above processes.

The gate dielectric 20 is comprised of an insulating material having a dielectric constant of about 4.0 or greater. All dielectric constants mentioned herein are relative to a vacuum unless otherwise noted. In one embodiment, the gate dielectric 20 comprises a high k material. The term "high k" denotes a dielectric having a dielectric constant of greater than 4.0, preferably greater than 7.0. Specifically, the gate dielectric 20 employed in the present invention includes, but is not limited to: an oxide, nitride, oxynitride and/or silicate including metal silicates and nitrided metal silicates. In one embodiment, it is preferred that the gate dielectric 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof.

The physical thickness of the gate dielectric 20 may vary, but typically, the gate dielectric 20 has a thickness from about 0.5 to about 10 nm, with a thickness from about 0.5 to about 3 nm being more typical.

Next, a gate conductor 22 is formed on the upper exposed surface of gate dielectric 20. The gate conductor 22 is comprised of a conductive material, including, for example, polySi, SiGe, a metal, a metal alloy, a metal silicide, a metal nitride, a metal carbide or combinations including multilayers thereof. When multilayers are present, a diffusion barrier (not shown), such as TiN or TaN, can be positioned between each of the conductive layers.

The gate conductor 22 is formed utilizing a conventional deposition process including for example, chemical vapor deposition, plasma enhanced chemical vapor deposition, atomic layer deposition, sputtering, plating, evaporation and any other like deposition processes. In embodiments in which poly Si or SiGe are used as the gate electrode, an in-situ deposition process can be used or alternatively deposition followed by ion implantation can be used. The gate conductor 22 may be doped via ion implantation at this point of the present invention so as to shift the work function of the gate electrode. Illustrative examples of dopant ions that can be used include As, P, B, Sb, Bi, In, Al, Ga, Tl or mixtures thereof. The thickness of the gate conductor 22 is not critical to the present invention. Typically, however, the thickness of the gate conductor 22 is from about 20 to about 250 nm.

The gate stack of each of FET 18 also includes a dielectric cap 24 located on a surface of the gate conductor 22. The dielectric cap 24, which comprises an oxide, nitride, oxynitride or any combination thereof, is formed utilizing a conventional deposition process including, for example, CVD, PECVD and evaporation. The thickness of the dielectric cap 24 may vary with ranges that are typically from about 10 to about 100 nm.

The first, narrow spacer 26, which can be formed before (as is the case in a replacement gate process flow) or after (as is the case in a conventional CMOS process flow) the gate stack, is comprised of the same or different dielectric material as that of dielectric cap 24. The first, narrow spacer 26 is typically formed by deposition and etching and its width, along the bottom most surface thereof, is typically from about 1 to about 50 nm. The narrow spacer 26 may be formed by an oxidation process as well. The first, narrow spacer 26 may also be referred to as an extension spacer since it is typically present during the formation of the source/drain extension regions.

After processing the substrate 12, forming the FET 18 and the first, narrow spacer 26, at least one recessed region 16 is formed in the substrate 12 at the footprint of each FET 18 using the first, narrow spacer 26 and dielectric cap 24 as an etch mask. The recessed region 16 may be formed utilizing an anisotropic etching process such as reaction ion etching (RIE). The anisotropic etching process provides recessed region 16 having an outer edge aligned with an outer edge of the isolation region 14, and another edge that is substantially aligned with the first, narrow spacer 26. The term "substantially aligned" denotes that the anisotropic etching process provides little or no undercut beneath the gate stack of the FET 18. Anisotropic etching, which is a preferred technique herein for providing the recessed regions 16, also helps to improve the isolation by resulting in less trench isolation recess. In addition to an anisotropic etch, the present invention also contemplates utilizing an isotropic etching process which typically provides a lateral undercut region (not shown) beneath the gate stack of each FET 18.

After providing the recessed region 16 in the substrate 12 as is shown in FIG. 1, a first epi semiconductor layer 28 having a lattice constant that is different from the lattice constant of the underlying semiconductor substrate 12 is formed within the recessed region 16. It is noted that the first epi semiconductor layer 28, together with the second epi semiconductor layer 30 (to be subsequently described in greater detail), form the inventive multilayer embedded stressor. The resultant structure including the first epi semiconductor layer 28 is shown, for example, in FIG. 2. For clarity, the various elements of the FET are not numbered in FIG. 2 or the remaining drawings.

In accordance with the present invention the first epi semiconductor layer 28 is undoped, lightly doped or a combination thereof. By "lightly doped", it is meant the first epi semiconductor layer 28 has a dopant concentration of about 1E18 atoms/cm$^3$ or less, with a dopant concentration from about 1e14 to about 1e18 atoms/cm$^3$ being even more typical. Depending on the type of device to be formed, the dopant within the first epi semiconductor layer 28 may be an n-type dopant or a p-type dopant.

When the semiconductor substrate 12 comprises single crystal silicon, the first epi semiconductor layer 28 comprises pseudomorphic SiGe or Si:C. Since the first epi semiconductor layer 28 has a different lattice constant compared to that of the semiconductor substrate 12, tensile or compressive stress is created in the recessed region 16. Such stressed regions in turn apply stress to the channel region of the FET. For example, SiGe is used to form a compressively stressed embedded stressor for creating compressive stress in the channel region of a pFET. The channel region of the FET is the area of the substrate 12 that is located beneath the gate stack of FET 18. Alternatively, Si:C can be used to form a tensilely stressed embedded stressor for creating tensile stress in the channel region of an nFET.

In accordance with the present invention, the first epi semiconductor layer 28 is formed within the recessed region 16 utilizing a conformal epi growth process. The utilization of a conformal epi process ensures that the first epi semiconductor layer 28 is conformal to the exposed surfaces of the semiconductor substrate 12 that defines the recessed region 16. That is, the conformal epi process provides a first epi semiconductor layer 28 within the recessed region 16 that follows the contour of the recessed region 16.

The thickness of the first epi semiconductor layer 28 may vary depending on the exact conditions of the epitaxial growth process used. Such conditions are well known to those skilled and thus further details regarding the epitaxial growth conditions are not provided herein. Typically, the first epi semiconductor layer 28 has a thickness from about 1 to about 30 nm, with a thickness from about 2 to about 15 nm being even more typical.

Figure 3:
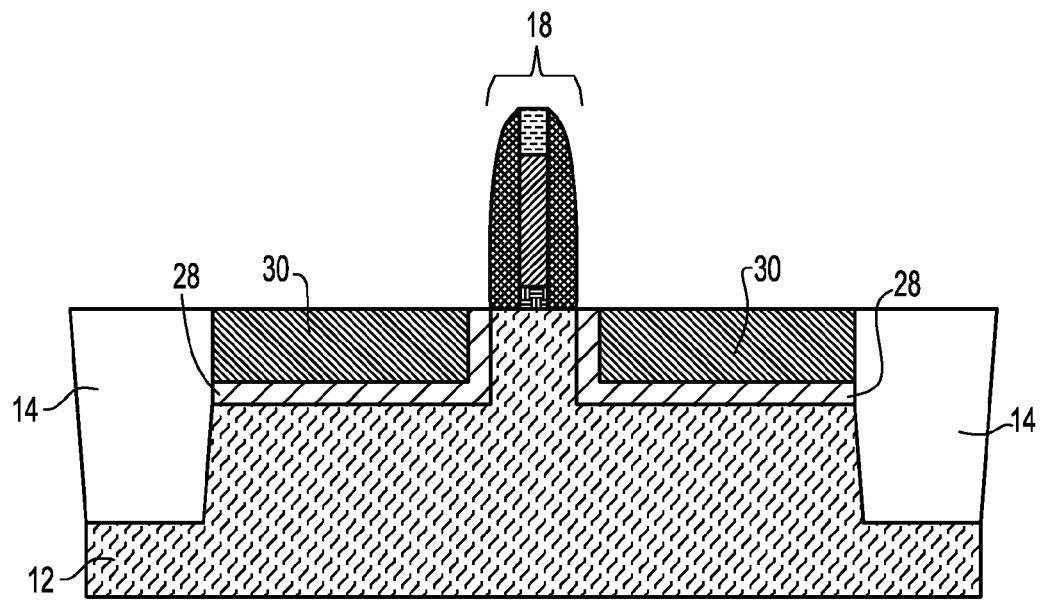
FIG. 3 is a pictorial representation (through a cross sectional view) depicting the structure of FIG. 2 after disposing a second epi semiconductor layer having the same lattice contact as the first epi semiconductor layer within the recessed portion of the substrate.

Next, and as is shown in FIG. 3, a second epi semiconductor 30 is formed within the recessed region 16 atop the first epi semiconductor layer 28 providing the structure shown, for example, in FIG. 3. In accordance with the present invention, the second epi semiconductor layer 30 has the same lattice constant as that of the first epi semiconductor layer 28 and typically it is composed of the same semiconductor material as the first epi semiconductor layer 28. The second epi semiconductor layer 28 differs however from the first epi semiconductor layer 28 in that the second epi semiconductor layer is highly doped. By "highly doped" it is meant a dopant concentration (p-type or n-type) that is greater than 1E18 atoms/cm$^3$, with a dopant concentration from greater than 1e18 to about 1e22 atoms/cm$^3$ being even more typical. In one embodiment of the present application when a single crystal Si substrate is used, the second epi semiconductor layer 30 comprises pseudomorphic SiGe or Si:C.

The second epi semiconductor layer 30 is formed by a conventional epitaxial growth process including the conformal epi process mentioned above.

Figure 4:
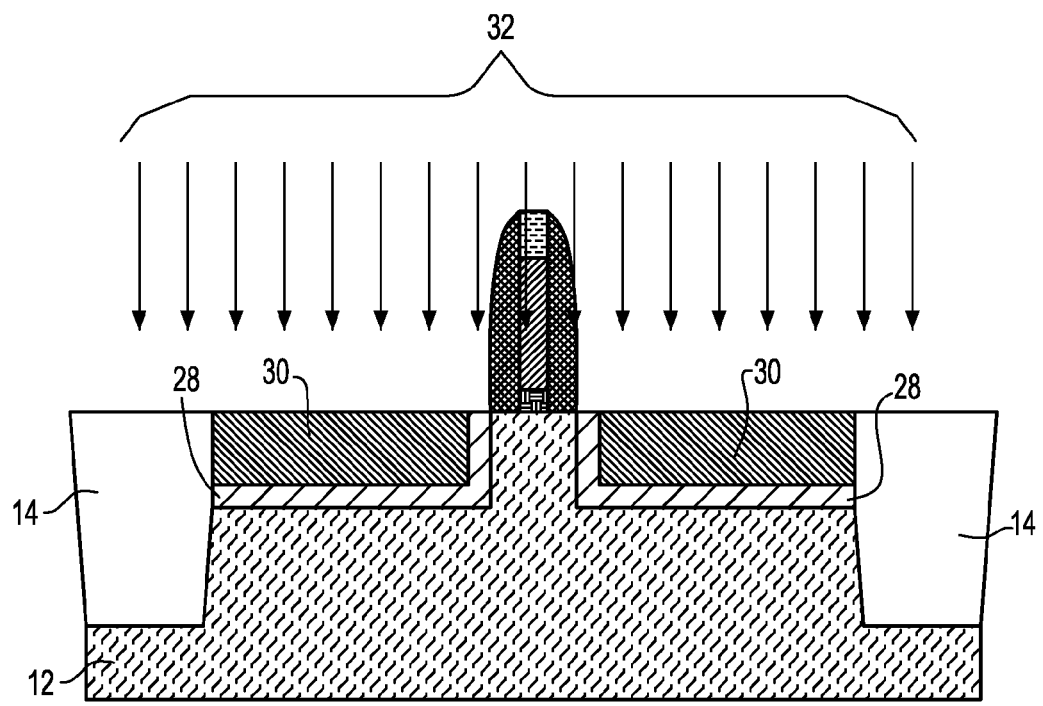
FIG. 4 is a pictorial representation (through a cross sectional view) depicting the structure of FIG. 3 during the formation of source/drain extension regions within upper portions of the first and second semiconductor layers.

FIG. 4 shows the structure during the ion implantation of source/drain extension regions wherein reference numeral 32 denotes the ions used in forming the source/drain extension regions. It is noted that the source/drain extension regions are formed into an upper portion of the second epi semiconductor layer 30 as well as an upper portion of the first epi semiconductor layer 28 that is located on the sidewalls of the mesa portion of the semiconductor substrate 12. The ion implantation of the source/drain extension regions is performed utilizing standard conditions that are well known those skilled in the art. Typically, source/drain extensions that have a shallow junction and a dopant concentration of between 1e19 to 1e23 atoms/cm$^3$ are provided. An activation anneal can follow the ion implant to activate the implanted species, or the activation of the source/drain extensions may occur in subsequent thermal processes that may be employed.

In some embodiments, a halo implant can be performed together with the extension implant. In yet other embodiments of the present invention, the halo implant can be performed prior to recessing the semiconductor substrate. Conventional halo implantation conditions are used in the present application.

Figure 5:
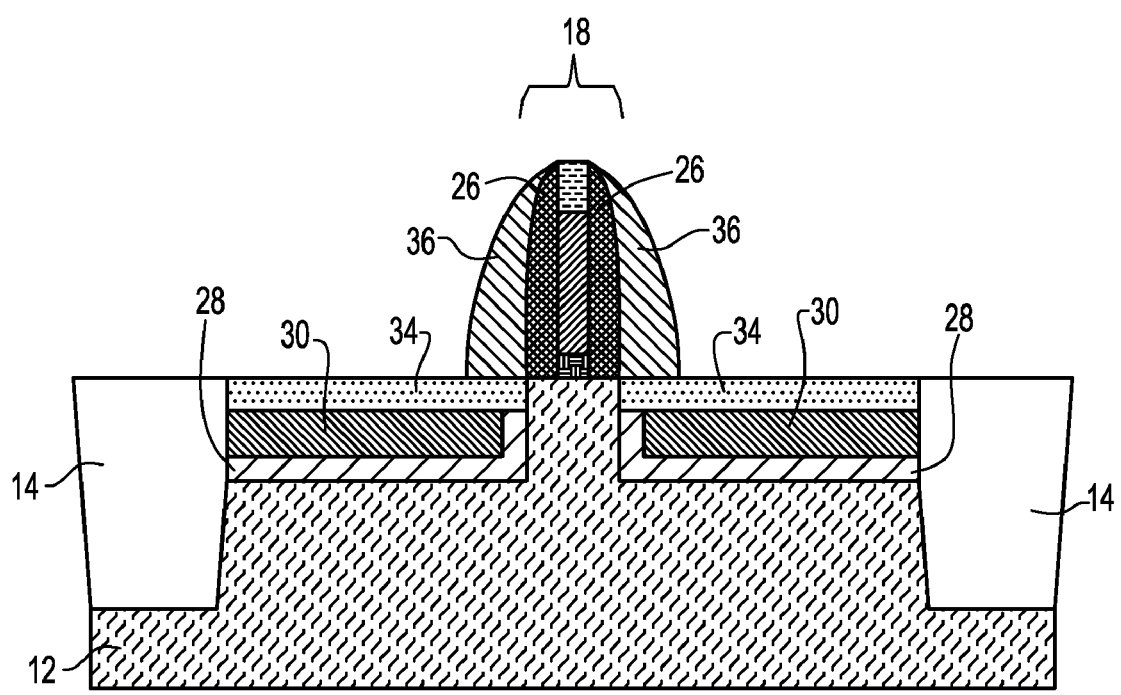
FIG. 5 pictorial representation (through a cross sectional view) depicting the structure of FIG. 4 after forming a second, wider spacer abutting the first, narrow spacer.

FIG. 5 shows the structure including the source/drain extension regions 34 that are located in an upper portion of the first and second epi semiconductor layers. FIG. 5 also shows the structure after a second, wide spacer 36 is formed abutting the first, narrow spacer 26. The second, wide spacer 36 is typically, but not necessarily always, comprised of a different insulating material as that of the first, narrow spacer 26. The width of second, wide spacer 36 as measured along the bottom surface thereof that abuts the second epi semiconductor layer 30 is from about 5 to about 100 nm.

Because the second epi semiconductor layer 30 is highly doped, traditional deep source/drain ion implantation can be avoided and thus no damages can be introduced in the multiple embedded stressor (i.e., epi semiconductor layers 28 and 30). In some embodiment however, a traditional deep source/drain ion implantation may be performed.

The process described above provides a structure including a multilayer embedded stressor (i.e., epi semiconductor layers 28 and 30) having a graded dopant profile that is in close proximity to the device channel. By "close proximity" it is meant the inventive stressor is within a distance of about 30 nm or less from the device channel. This distance is typically the width of the first, narrow spacer 26. In prior art processes, the embedded stressors are spaced further from the device channel, typically by the width of the first and second spacers described above.

Another advantage of the present application is that the inventive multilayer embedded stressor having the graded dopant profile and the at least first epi semiconductor layer that is conformally disposed within the recessed region provides improved threshold voltage roll-off and little or no short channel effects as compared to a conventional structures. In the epi process or following thermal process, due to the first undoped or lightly doped first epi layer, there is much less dopant diffuse into the channel while the whole stressor has very close proximity to the channel, which significantly reduces short channel effects and maintains high channel stress.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure having a stressed device channel comprising:
    providing at least one field effect transistor having an extension spacer on a surface of a mesa portion of a semiconductor substrate, said semiconductor substrate having a recessed region at a footprint of the at least one field effect transistor;
    conformally growing a first epitaxial semiconductor layer on exposed surfaces of said semiconductor substrate in said recessed region and on an entirety of sidewalls of said mesa portion of the semiconductor substrate, said first epitaxial semiconductor layer having a lattice constant that is different from a lattice constant of said semiconductor substrate;
    forming a second epitaxial semiconductor layer on said first epitaxial semiconductor layer, wherein said second epitaxial semiconductor has the same lattice constant as the first epitaxial semiconductor layer and a higher dopant concentration than the first epitaxial semiconductor layer, in which the first epitaxial layer and the second epitaxial layer provide deep source and drain regions, wherein the deep source and drain regions are formed via in-situ doping during the forming of the first epitaxial layer and the second epitaxial layer, in which the second epitaxial semiconductor layer is directly present on the first epitaxial layer, and the second epitaxial layer has an upper surface that is coplanar with an upper surface of the mesa portion of the semiconductor substrate; and
    forming an extension region within upper portions of said the first and second epitaxial semiconductor layers.

2. The method of claim 1 wherein said recessed region is formed by anisotropic etching.

3. The method of claim 1 wherein said recessed region is formed by isotropic etching.

4. The method of claim 1 wherein said first epitaxial semiconductor layer is undoped or has a dopant concentration of about 1E18 atoms/cm$^3$ or less.

5. The method of claim 1 wherein said second epitaxial semiconductor layer has a dopant concentration of greater than 1E18 atoms/cm$^3$.

6. The method of claim 1 wherein said semiconductor substrate is a single crystal Si substrate, and said first and second epitaxial semiconductor layers form a multilayer embedded stressor that comprises SiGe.

7. The method of claim 1 wherein said semiconductor substrate is a single crystal Si substrate, and said first and second epitaxial semiconductor layers form a multilayer embedded stressor that comprises Si:C.

8. The method of claim 1 wherein said at least one field effect transistor comprises a pFET and an nFET, and said first and second epitaxial semiconductor layers associated with said pFET are compressively stressed, and said first and second epitaxial semiconductor layers associated with said nFET are tensilely stressed.

9. The method of claim 1 further comprises forming a second spacer adjacent said extension spacer, said second spacer is formed after said step of forming said extension region.

* * * * *